(12) United States Patent
Kenane et al.

(10) Patent No.: US 9,953,887 B2
(45) Date of Patent: Apr. 24, 2018

(54) MEASURING INDIVIDUAL LAYER THICKNESS DURING MULTI-LAYER DEPOSITION SEMICONDUCTOR PROCESSING

(71) Applicant: Lam Research Corporation, Fremont, CA (US)

(72) Inventors: Boaz Kenane, Portland, OR (US); Edward Augustyniak, Tualatin, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 24 days.

(21) Appl. No.: 15/130,176

(22) Filed: Apr. 15, 2016

(65) Prior Publication Data

US 2016/0307812 A1    Oct. 20, 2016

Related U.S. Application Data

(60) Provisional application No. 62/148,660, filed on Apr. 16, 2015.

(51) Int. Cl.

| | |
|---|---|
| *G01R 31/26* | (2014.01) |
| *H01L 21/66* | (2006.01) |
| *C23C 16/52* | (2006.01) |
| *H01L 21/67* | (2006.01) |

(52) U.S. Cl.
CPC .............. *H01L 22/26* (2013.01); *C23C 16/52* (2013.01); *H01L 21/67253* (2013.01)

(58) Field of Classification Search
CPC . H01L 22/26; H01L 21/67253; H01L 21/681; C23C 16/52; C23C 16/50; C23C 16/45565

USPC .......................................................... 438/16
See application file for complete search history.

(56) References Cited

U.S. PATENT DOCUMENTS

| | | | |
|---|---|---|---|
| 5,399,229 A | * | 3/1995 | Stefani .................. B24B 37/013 156/345.25 |
| 5,929,997 A | | 7/1999 | Lin |
| 6,694,284 B1 | | 2/2004 | Nikoonahad et al. |
| 6,847,433 B2 | | 1/2005 | White et al. |
| 7,494,830 B2 | | 2/2009 | Liu et al. |
| 2003/0071994 A1 | | 4/2003 | Borden et al. |
| 2006/0249859 A1 | | 11/2006 | Eiles et al. |
| 2010/0022033 A1 | * | 1/2010 | Kanarik ................. H01L 22/12 438/14 |
| 2014/0118751 A1 | | 5/2014 | Rajagopalan et al. |

* cited by examiner

*Primary Examiner* — Thien F Tran
(74) *Attorney, Agent, or Firm* — Weaver Austin Villeneuve & Sampson LLP

(57) ABSTRACT

In situ wafer metrology is conducted to reliably obtain deposition thickness for each successive layer in a multi-layer deposition. A wafer to be processed is positioned in a processing station of a deposition process tool, the process tool having a reflectometer metrology apparatus for optically determining thickness of a deposited layer on the wafer. Prior to commencing a deposition, the wafer is aligned in the processing station such that an optical metrology spot generated by the reflectometer metrology apparatus will align with an unpatterned central region of a die on a wafer during a deposition conducted on the wafer in the tool. Thereafter, the thickness of a deposited layer on the wafer is reliably measured and monitored in situ.

8 Claims, 3 Drawing Sheets

MEASURING INDIVIDUAL LAYER THICKNESS DURING MULTI-LAYER DEPOSITION SEMICONDUCTOR PROCESSING

CROSS-REFERENCE TO RELATED APPLICATION

This application claims benefit of U.S. Provisional Patent Application No. 62/148,660, filed Apr. 16, 2015, and titled "MEASURING INDIVIDUAL LAYER THICKNESS DURING MULTI-LAYER DEPOSITION SEMICONDUCTOR PROCESSING," which is incorporated by reference herein in its entirety and for all purposes.

BACKGROUND

Metrology is commonly used for defect detection and measurement of material deposition or removal in semiconductor manufacturing and like processes such as semiconductor device manufacturing, memory disk manufacturing and flat panel display manufacturing. Semiconductor wafer metrology is typically conducted using an optical metrology tool, such as an optical reflectometry tool. White light reflectometry (WLR) processes and tools have been developed for deposited film thickness detection. An example is the Impulse series of metrology systems available from Nanometrics Incorporated. Wafer metrology is generally conducted after wafer processing and in a separate device (e.g., a wafer metrology system), or with an integrated metrology system attached to the Equipment Front End Module (EFEM).

SUMMARY

This disclosure relates in part to in situ wafer metrology conducted to reliably obtain deposition thickness for each successive layer in a multi-layer deposition. A wafer to be processed is positioned in a processing station of a deposition process tool, the process tool having a reflectometer metrology apparatus for optically determining thickness of a deposited layer on the wafer. Prior to commencing a deposition, the wafer is aligned in the processing station such that an optical metrology spot generated by the reflectometer metrology apparatus will align with an unpatterned central region of a die on a wafer during a deposition conducted on the wafer in the tool. Thereafter, the thickness of a deposited layer on the wafer is reliably measured and monitored in situ.

The deposition may be a multi-layer deposition, such as one that forms a Vertically Integrated Memory (VIM) device. The multi-layer deposition may form a memory die multi-stack, such as a V-NAND. The V-NAND may have as many as 50 or more layers of film that alternate between two material types, for example oxide and nitride.

In another aspect, the disclosure relates to an apparatus for conducting in situ wafer metrology. The apparatus includes a plasma enhanced chemical vapor deposition system for performing at least one of oxide/nitride (ONON) and oxide/polysilicon (OPOP) film stack deposition, and integrated reflectometer metrology apparatus. An optical metrology spot generated by the reflectometer metrology apparatus can be aligned with an unpatterned central region of a die on a wafer positioned in a deposition process chamber during a deposition conducted on a wafer in the tool.

The apparatus can have a showerhead disposed in the deposition process chamber, the showerhead having a purged optical channel for application of the optical metrology spot to the wafer, the purged optical channel routed through a gas injection hole in showerhead. The apparatus can also have a controller for controlling operations in the apparatus. The controller can include machine-executable instructions for: positioning a wafer to be processed in a processing station of a deposition process tool, the process tool having a reflectometer metrology apparatus for optically determining thickness of a deposited layer on the wafer; prior to commencing a deposition, aligning the wafer in the processing station such that an optical metrology spot generated by the reflectometer metrology apparatus will align with an unpatterned central region of a die on a wafer during a deposition conducted on the wafer in the tool; thereafter, measuring and monitoring in situ the thickness of a deposited layer on the wafer. The deposition conducted by the apparatus pursuant to the executable instructions may be a multi-layer deposition, and the deposition thickness can be reliably obtained for each successive layer in the multi-layer deposition.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Certain semiconductor and like manufacturing processes present considerable metrology challenges. For example, Vertically Integrated Memory (VIM) applications, such as memory die multi-stacks (e.g., V-NAND), may employ as many as 50 (or more) layers of film that alternate between two types, typically oxide and nitride. Individual layer thickness contributes to device gate width critical dimension, which is extremely important to control. Such structures contain too many layers to do effective metrology on all layers following a completed multi-layer deposition. And full stack thickness cannot be reliably measured with non-destructive methods. Optical methods such as ellipsometry require extreme precision and extreme computation power to resolve models with these many layers. In addition, process times for VIM are long, placing high premium on rapid problem detection. In situ metrology (reflectometry) could allow for the real time (e.g., as deposition occurs)

measurement of layer thickness as each layer is deposited for improved quality and efficiency.

Complications can also arise from optical inference caused by features on a patterned substrate. If the optical metrology spot (metrology light beam impacting the wafer) for the reflectometry metrology tool falls on a patterned portion of a die on the wafer, the metrology results will be unreliable.

This disclosure relates in part to methods and apparatus for conducting reliable in situ metrology (reflectometry) for V-NAND applications. For V-NAND, the patterning is largely or entirely confined to the die perimeter, leaving the die center substantially pattern-free. The dies are also relatively large in size (e.g., about 1 cm×1 cm). The metrology spot for the reflectometer metrology tool is less than 1 mm in diameter.

Figures 1A, 1B:
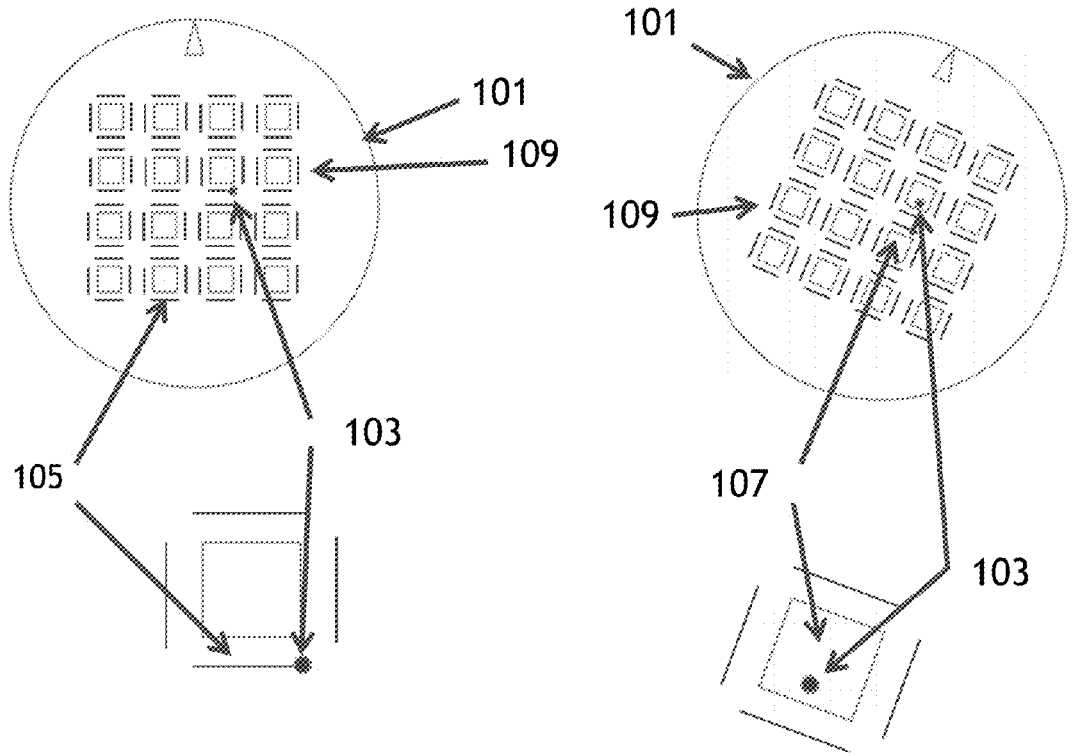
FIGS. 1A-B provide schematic illustrations of considerations and an implementation of in situ wafer metrology in accordance with this disclosure.

Referring to FIG. 1A, if the wafer 101 is randomly aligned, or aligned with respect to other concerns, as is typical, the metrology optical spot 103 could easily hit the patterned die periphery 105, rather than the more central, pattern-free portion 107 of the die 109 where the metrology is best conducted. However, the nature of the patterning and the relatively large die size provide an opportunity to align the metrology spot with the more central, largely pattern-free portion of the die to do reliable in situ metrology.

As illustrated in FIG. 1B, a wafer to be processed may be positioned in a processing station of the deposition process tool. Prior to commencing the deposition, the process tool wafer aligner may be controlled with reference the wafer map to align the wafer in the processing station such that the metrology spot will line up with an unpatterned central region of a die on each wafer during the deposition process run. Aligner accuracy of 0.1 degree allows for placement accuracy of than 0.1 mm or less, and can allow for reliable positioning of the metrology spot in a pattern-free area in accordance with the wafer map. Thereafter, the deposition layer thickness for each deposited layer can be measured and monitored in situ and in real time so that the proper deposition thickness can be reliably achieved for each successive layer in the multi-layer deposition.

In this way, with reliable integrated in situ metrology, V-NAND multilayer stack depositions may be conducted with greater accuracy and efficiency.

Apparatus

Figure 2:
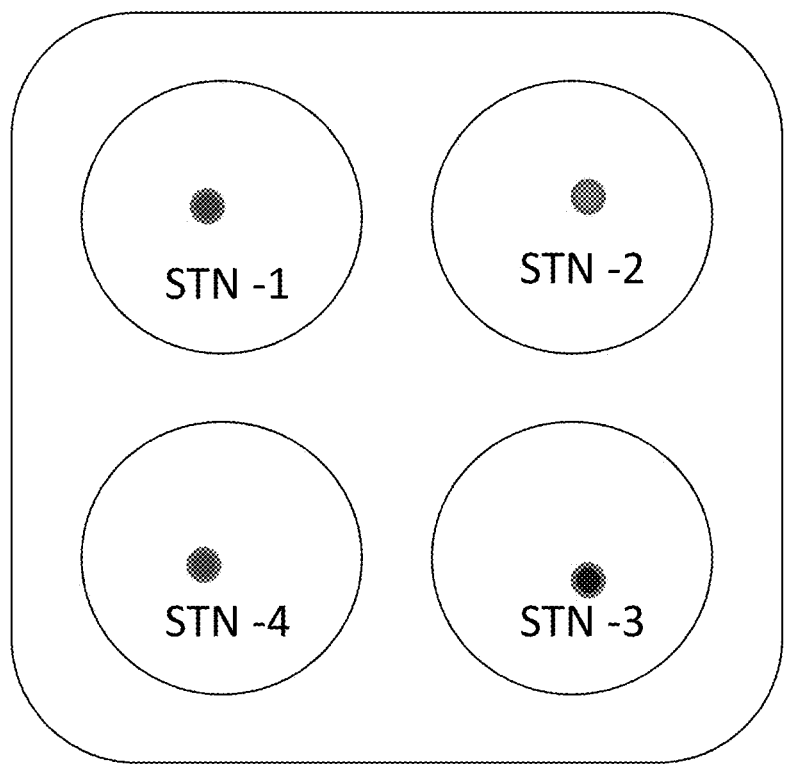
FIG. 2 is a general schematic illustrating implementation of in situ wafer metrology in a multi-station context in accordance with disclosed embodiments.

The disclosed metrology method may be conducted on single station or multi-station deposition processing apparatus. Multi-station apparatus can be advantageous for enhancing throughput. When implemented in a multi-station context, the metrology can be conducted on each wafer on a single station of the multi-station apparatus, with a single metrology point per wafer, as illustrated in FIG. 2.

Figure 3:
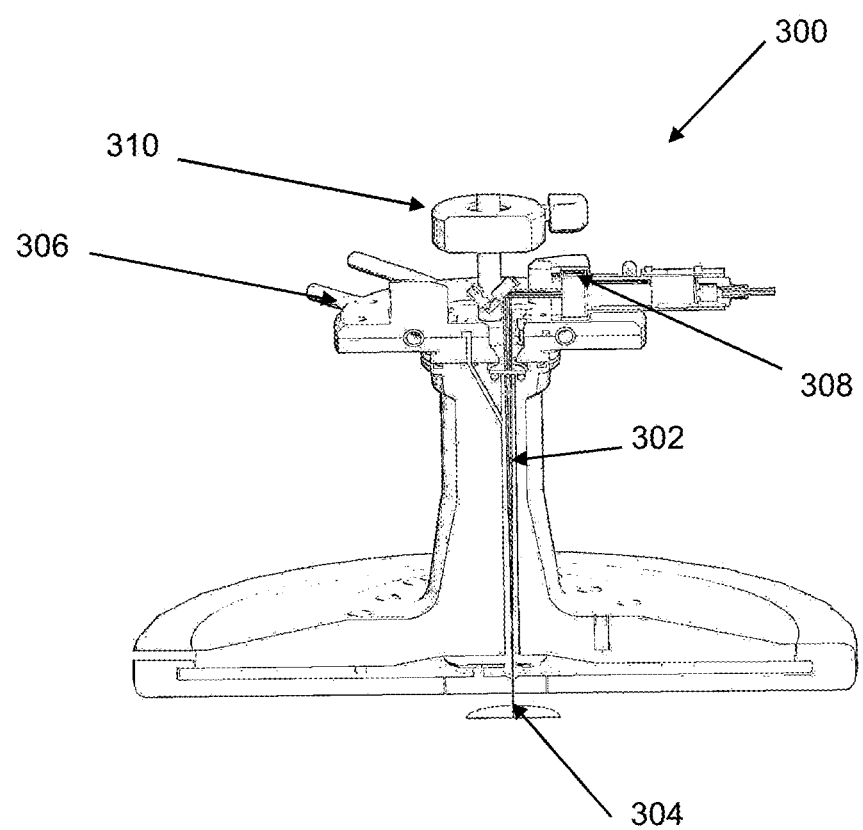
FIG. 3 depicts implementation of in situ wafer metrology by without affecting the deposition process by routing a purged optical channel through a single gas injection hole in a processing chamber showerhead, in accordance with certain disclosed embodiments.

In situ metrology during deposition based on optical reflectometry can be implemented in a deposition tool used for depositing multilayer film stacks, such as a VECTOR® Q Strata™ PECVD (plasma enhanced chemical vapor deposition) system. For this V-NAND process step, the system can perform both oxide/nitride (ONON) and oxide/polysilicon (OPOP) film stack deposition. Referring to FIG. 3, the metrology (reflectometry) can be integrated without affecting the deposition process by routing a purged optical channel 302 through a gas injection hole 304 in the tool showerhead 300. The showerhead 300 can further incorporate a cooling plate 306 and sensor head 308 adjacent to the showerhead neck 310.

The tool often includes a system controller having programming to control the deposition and metrology processes. The controller may execute system control software, which may be stored in a mass storage device, loaded into a memory device, and executed on a processor. The software may be transferred over a network in some cases. Various process tool component subroutines or control objects may be written to control operation of the process tool components necessary to carry out various process tool processes. The system control software may be coded in any suitable computer readable programming language. In some embodiments, the system control software may include input/output control (IOC) sequencing instructions for controlling the various parameters discussed herein. The system controller may also be associated with other computer software and/or programs, which may be stored on a mass storage device or memory device associated with the controller. Examples of programs or sections of programs for this purpose include a wafer positioning and alignment program, a plasma gas control program, a reactant gas control program, a pressure control program, a temperature control program, a plasma control program, and a metrology control program.

With reliable integrated in situ metrology in the tool, V-NAND multilayer stack depositions may be reliably and efficiently conducted.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems and apparatus of the present embodiments. Accordingly, the present embodiments are to be considered as illustrative and not restrictive, and the embodiments are not to be limited to the details given herein.

What is claimed is:

1. A method of conducting in situ wafer metrology, comprising:
    positioning a wafer to be processed in a processing station of a deposition process tool, the process tool having a reflectometer metrology apparatus for optically determining thickness of a deposited layer on the wafer;
    prior to commencing a deposition, aligning the wafer in the processing station such that an optical metrology spot generated by the reflectometer metrology apparatus will align with an unpatterned central region of a die on a wafer during a deposition conducted on the wafer in the tool;
    thereafter, measuring and monitoring in situ the thickness of a deposited layer on the wafer.

2. The method of claim 1, wherein the deposition is a multi-layer deposition.

3. The method of claim 2, wherein the deposition thickness is reliably obtained for each successive layer in the multi-layer deposition.

4. The method of claim 3, wherein the multi-layer deposition forms a Vertically Integrated Memory (VIM) device.

5. The method of claim 4, wherein the multi-layer deposition forms a memory die multi-stack.

6. The method of claim 5, wherein memory die multi-stack is a V-NAND.

7. The method of claim 6, wherein the V-NAND comprises 50 or more layers of film that alternate between two material types.

8. The method of claim 7, wherein the two material types are oxide and nitride.

\* \* \* \* \*